United States Patent
Lemay et al.

(10) Patent No.: US 6,786,617 B2
(45) Date of Patent: Sep. 7, 2004

(54) NIGHT VISION IMAGING SYSTEM (NVIS) COMPLIANT INSTRUMENT PANEL COMPONENT

(75) Inventors: Eric Lemay, Montreal (CA); Sylvain Demers, Ile Bizard (CA); Bruno Pavan, St-Eustache (CA)

(73) Assignee: CMC Electronique Inc., Ville St-Laurent (CA)

( * ) Notice: Subject to any disclaimer, the term of this patent is extended or adjusted under 35 U.S.C. 154(b) by 0 days.

(21) Appl. No.: 10/353,080

(22) Filed: Jan. 29, 2003

(65) Prior Publication Data

US 2004/0145893 A1 Jul. 29, 2004

(51) Int. Cl.[7] .................................................. F21V 9/06
(52) U.S. Cl. ...................... 362/230; 362/235; 362/293
(58) Field of Search .................................. 362/230, 235, 362/293, 471, 231, 555, 545, 510, 800, 2

(56) References Cited

U.S. PATENT DOCUMENTS

| | | | |
|---|---|---|---|
| 4,580,196 A | * | 4/1986 | Task .............................. 362/471 |
| 4,722,028 A | * | 1/1988 | Brannon et al. ................ 362/29 |
| 4,849,755 A | | 7/1989 | Benas |
| 4,934,793 A | | 6/1990 | Klein |
| 4,947,291 A | | 8/1990 | McDermott |
| 4,963,798 A | | 10/1990 | McDermott |
| 5,031,080 A | | 7/1991 | Aikens et al. |
| 5,083,246 A | * | 1/1992 | Lambert ....................... 362/471 |
| 5,086,378 A | | 2/1992 | Prince |
| 5,143,433 A | | 9/1992 | Farrell |
| 5,150,257 A | | 9/1992 | Mohabbatizadeh et al. |
| 5,211,463 A | | 5/1993 | Kalmannash |
| 5,268,788 A | | 12/1993 | Fox et al. |
| 5,300,788 A | | 4/1994 | Fan et al. |
| 5,380,204 A | | 1/1995 | Decker |
| 5,453,405 A | | 9/1995 | Fan et al. |
| 5,617,080 A | | 4/1997 | Morich |
| 5,661,578 A | | 8/1997 | Habind et al. |
| 5,685,637 A | | 11/1997 | Chapman et al. |
| 5,686,786 A | | 11/1997 | Lang et al. |
| 5,803,579 A | | 9/1998 | Turnbull et al. |
| 5,886,681 A | | 3/1999 | Walsh et al. |
| 5,984,494 A | | 11/1999 | Chapman et al. |
| 6,039,451 A | | 3/2000 | Grave |
| 6,144,352 A | | 11/2000 | Matsuda et al. |
| 6,238,076 B1 | | 5/2001 | Pascale et al. |
| 6,247,825 B1 | * | 6/2001 | Borkowski ..................... 362/23 |
| 6,342,897 B1 | | 1/2002 | Wen |
| 6,403,985 B1 | | 6/2002 | Fan et al. |
| 6,419,372 B1 | | 7/2002 | Shaw et al. |
| 2001/0010371 A1 | | 8/2001 | Carey et al. |
| 2001/0020705 A1 | | 9/2001 | Miyata |
| 2001/0026011 A1 | | 10/2001 | Roberts et al. |

* cited by examiner

Primary Examiner—Thomas M Sember
Assistant Examiner—B Q Truong
(74) Attorney, Agent, or Firm—Ogilvy Renault; James Angelhart

(57) ABSTRACT

A light emitting diode assembly consisting of separate dies, individually mounted or commonly packaged into one assembly providing an energy spectrum compliant with a night vision imaging system standard, such as NVIS Green A class A. The light emitting diode combination or assembly does not require any external filtering and/or fluorescent material to achieve the NVIS Green A class A chromaticity and radiance requirements. An optical filter absorbing part of visible energy to improve radiance performance. A conformal coating including an absorbing agent for filtering small infrared emissions may be used for improving compliance performance. Use of light emitting diode with conformal coating with absorbing for compliance to NVIS Green B, class A.

18 Claims, 3 Drawing Sheets

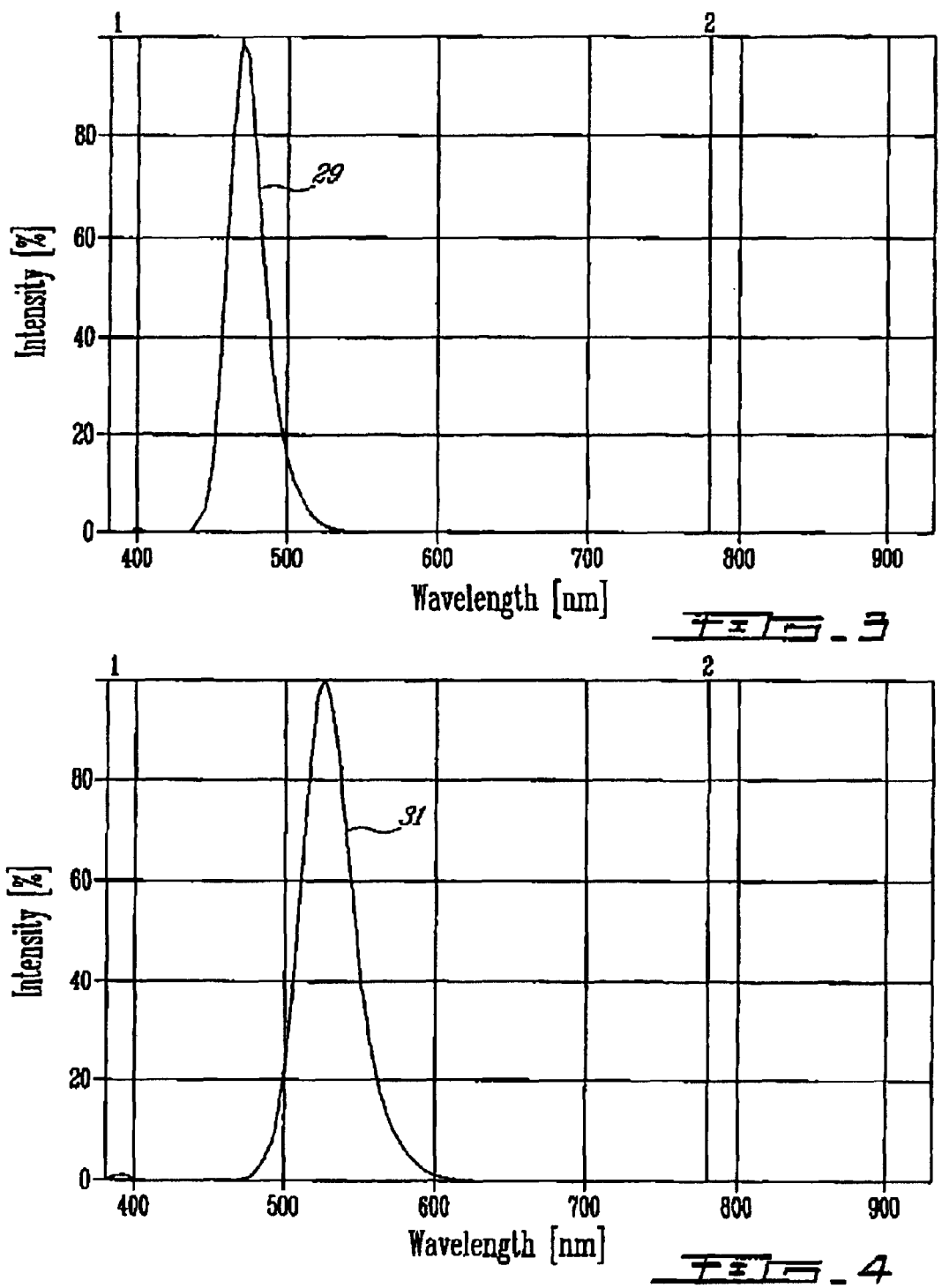

NIGHT VISION IMAGING SYSTEM (NVIS) COMPLIANT INSTRUMENT PANEL COMPONENT

FIELD OF THE INVENTION

The present invention relates to NVIS-compliant instruments and a method for manufacturing same.

BACKGROUND OF THE INVENTION

Illumination of cockpit instruments is achieved by the use of different lighting technologies. They include electroluminescent lamps, incandescent lamps and Light Emitting Diodes (LEDs).

These different illumination technologies are used both in the commercial and military avionics industry. Each of the industry has different illumination color requirements covered by various government specifications. Some military or paramilitary application, including airborne but not limited to, require specific lighting requirements due to their usage in night operation. During these operations, night vision goggles are used by flight crews to enhance terrain visibility outside the aircraft in low visibility conditions. The cockpit illumination must be such that it does not emit energy that could interfere with the infrared sensitive night vision goggles or other night vision equipment. Illumination adhering to this standard is known as NVIS compliant light. The night vision goggles used in military aircrafts are responsive to low light level intensities, typically in the 625 nm to 920 nm band, including the red and infrared portions of the spectrum. The devices employ high gain electronic image intensifiers that are sensitive to light in the near-infrared and infrared regions. If a high level of infrared output is emitted by the illumination system and reaches the observer, a phenomenon known as blooming occurs, whereby the observer suffers from night vision impairment to an unacceptable degree. The infrared emissions from the cockpit illumination must be removed or eliminated to a degree that there is no interference with the use of the night vision equipment. At the same time, the illumination must be such that it provides sufficient brightness for direct viewing with the unaided adapted eye. Accordingly, the instrument emissions in the infrared region should be minimized, without affecting the portion of the visible spectrum to which the human eye is most sensitive.

Cockpits are designed and manufactured to meet the military quantitative requirements for energy distribution and color as defined in government specification. In the past, these requirements have been achieved by different filtering techniques using glass or plastic or a combination thereof. The need for requirements compliance has increased manufacturing costs given the optical requirements and the state of the art. Integration of filtering material into a single component has been claimed in U.S. Pat. No. 5,686,786 for incandescent based technology.

Illumination requirements have been achieved by using electroluminescent lamps, incandescent lamps and LEDs as light source. The radiance and chromaticity requirements as described above have required the development of filtering materials. In fact, the large energy spectrum of the incandescent lamps required absorbing filters of different materials and shapes. Such filters are designed for high absorption of the longer wavelengths in the infrared region of the spectrum and high transmission at shorter wavelengths in the visual region. However, the overall efficiency after such filters is relatively low, as they absorb significant amounts of energy in the visual spectrum, lowering the overall brightness.

The use of electroluminescent lamps required similar filtering material despite the narrower energy distribution of the phosphors used in order to eliminate small quantity of energy present above 600 nm.

The introduction of Blue LED dies lead to much advancement in wide spectrum LED based illumination. As an example, recent developments by Nichia of Japan with the introduction of product such as NSPW310AS, described in U.S. Pat. No. 6,069,440 to Shimizu et al., that added Yttrium Aluminum Garnet doped with cerium to the Blue LED package, has provided a promising alternative to the incandescent and electroluminescent based technologies. The light emitting device described above is coated with a phosphor such that it converts the blue emission of the light emitting diode into a very broad spectrum. Other similar approaches combining various phosphors and excitation wavelengths are also available.

By nature, the LED has proven to be extremely reliable compared to incandescent lamps when exposed to vibration and thermal cycling. The LED has also demonstrated longevity much greater than the electroluminescent and incandescent lamps. Moreover, the LED requires less energy for similar brightness output.

Despite this recent improvement, the LED, given its energy spectrum also requires the use of external filtering component in order to absorb energy in the infrared and red spectrum. In the prior art, this external filtering component or material is external to the LED. The use of filtering material in this spectrum region, usually above 700 nm, impacts the efficiency and significantly increases the cost associated with the manufacturing of the final assembly. In practice, the filtering component is made of polycarbonate and requires the use of expensive metallic dyes to sustain high molding temperatures. In general, the filtering component has to be bonded and an optical seal between the LED and the filtering material is required in order to avoid leakage of unfiltered light which would not be compliant with night vision imaging system standards. In short, the fact of not having a light source with low radiance and the required chromaticity increases overall cost while reducing the optical efficiency. There exists a need therefore for an illumination source that is both compliant to night vision imaging system requirements and incurs low manufacturing costs.

SUMMARY OF THE INVENTION

Accordingly, it is an object of this invention to provide an assembly of light emitting diodes combining to produce light compliant with a night vision imaging system standard, comprising at least one green light emitting diode die having an emission of a first dominant wavelength, at least one blue light emitting diode die having an emission of a second dominant wavelength, an electronic instrument component containing the green light emitting diode die and the blue light emitting diode die arranged to provide a mixing of said green light emitting diode emission and said blue light emitting diode such as to achieve a desired spectral response. The assembly is such that a sufficient quantity of said green light emitting diode emission is mixed with a sufficient quantity of said blue light emitting diode emission such that said resulting spectral response allows operator to perceive an essentially green light of chromaticity and radiance characteristics compliant to the night vision imaging system standard. The combination of such LED dies increases the optical efficiency and allows significant cost reduction in both material and labor compared to the existing technologies and processes.

It is another object of this invention to provide an electronic component for use in a night vision imaging system environment comprising a printed circuit board assembly comprising a light source having an emission non compliant to the night vision imaging system standard, a conformal coating covering the printed circuit board assembly, including an absorbing agent, for filtering quantities of energy of the emission, such that the infrared emission of the printed circuit board assembly is filtered by the absorbing agent.

Yet another object of this invention is to provide a method of manufacturing a printed circuit board assembly for use in a night vision imaging system environment comprising the steps of providing a printed circuit board assembly having infrared energy emissions, coating the printed circuit board assembly with a conformal coating including an absorbent agent, for filtering the infrared energy emissions and installing the printed circuit board assembly in an instrument panel such that the emissions are compliant to night vision applications for radiance and chromaticity .

BRIEF DESCRIPTION OF THE DRAWINGS

The invention will be better understood by way of the following detailed description of a preferred embodiment with reference to the appended drawings, in which:

FIG. 3 is a graphical representation of the energy response generated by a blue LED used in accordance with the present invention.

FIG. 4 is a graphical representation of the energy response generated by a green LED used in accordance with the presence invention.

DETAILED DESCRIPTION OF THE PREFERRED EMBODIMENT

Figure 2:
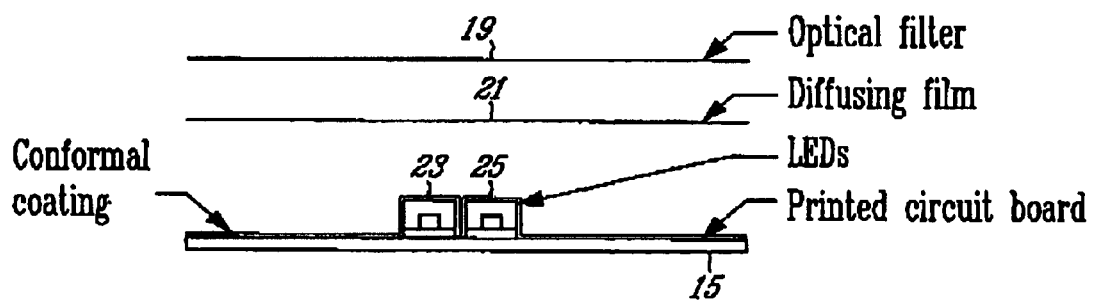
FIG. 2 is a graphical representation of a typical assembly of light emitting diodes producing light compliant with a night vision imaging system standard.

According to the present invention, and as represented in FIG. 2, an assembly of light emitting diodes combining to produce light is provided. The combination involves using light emitting diodes that, when blended and assembled, will be compliant to NVIS requirements, chromaticity and radiance as presented in military requirements controlled by government specifications. In the preferred embodiment of the current invention, the requirements are NVIS Class A Green A chromaticity characteristics, defined as a chromaticity radius of 0.037 with respect to a reference point u'=0.088 and v'=0.543 based on the chromaticity diagram 1976 UCS. The same NVIS class A Green A specification regulates the radiance limit such that the level of emitted energy multiplied by the response curve of night vision goggles is smaller than 1.7E-10. Another standard, NVIS class A Green B, requires a chromaticity radius of 0.057 with respect to a reference point u'=0.131 and v'=0.623 based on the chromaticity diagram 1976 UCS and a radiance limit of 1.7E-10. The later being obtained by the use of absorbing coating. While the description of the preferred embodiment refers to the NVIS standards, it will be understood by those skilled in the art that other international standards may be adhered to in the implementation.

Still in reference to FIG.2, in a preferred embodiment, the assembly of light emitting diodes comprises a first LED 23 emitting light of a first wavelength and a second LED 25 emitting light of a second wavelength, placed in close proximity on a printed circuit board 27. In a preferred embodiment, the first light emitting diode 23 has a dominant wavelength of 505 nm to 540 nm, such as the ETG-0603CE525-140C (green LED) manufactured by ETG and the second light emitting diode 25 has a dominant wavelength of 430 nm to 480 nm, such as the ETG-0603CE470-140-C(blue LED) manufactured by ETG.

FIG. 3 is a graphical representation of the spectral response 29 of a blue LED to be used according to the present invention. FIG. 4 is a graphical representation of the spectral response 31 of a green LED to be used according to the present invention.

Figure 1:
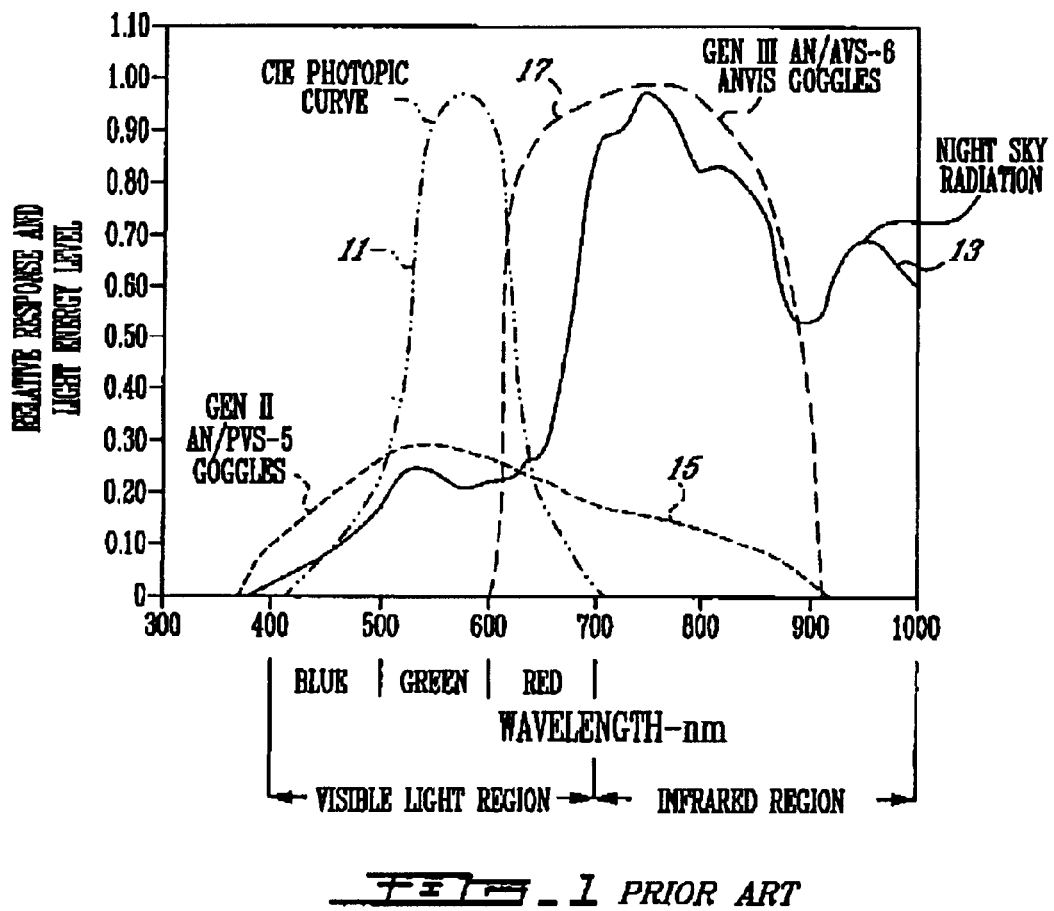
FIG. 1, based on FIG. 6 of U.S. Pat. No. 6,247,825, is a graphical representation of the frequency relative responses of night vision imaging systems and human vision.

FIG. 1 is a graphical representation of the frequency responses of particular night vision goggle, 17, as well as the typical response of the human eye 11. As is shown, the light response generation III 17 night vision is depicted graphically. As it can be seen, there is very little overlap between the human eye response 11 and generation III 17 night vision imaging systems. Accordingly, in accordance with the preferred embodiment of the present invention, the light emitting diode assembly provides illumination in a range which does not interfere with night vision goggle systems, and thus which can be utilized safely.

Figure 5:
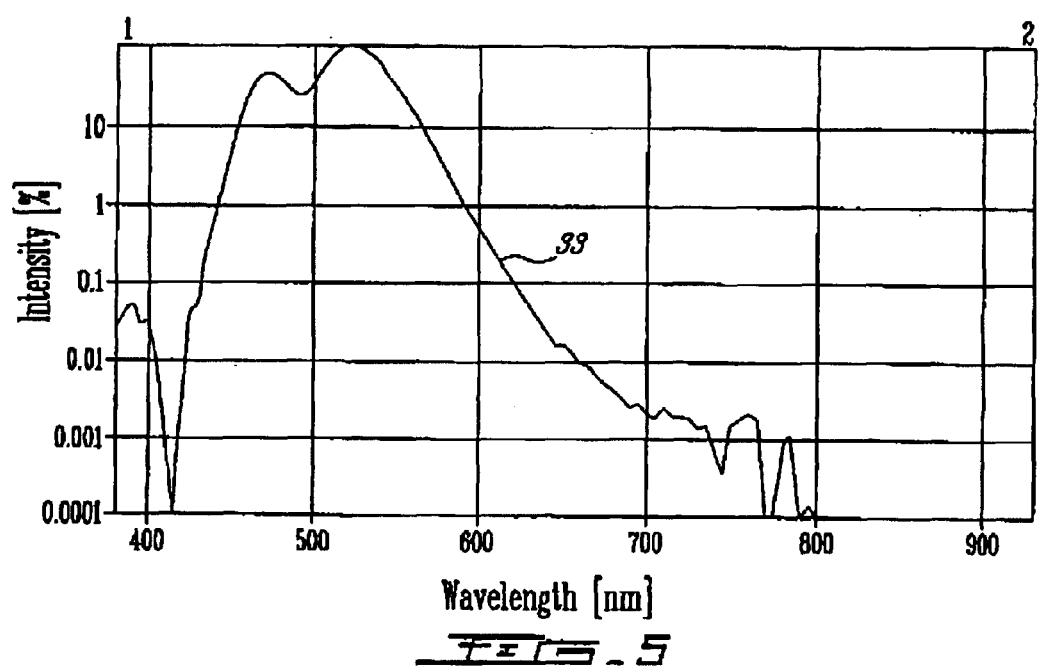
FIG. 5 is a graphical view of the energy of light generated by the LED assembly utilized in accordance with the present invention.

The improved relationship between night vision apparatus response and the spectral output of the led assembly according to the present invention and as depicted in FIG. 5, is also readily apparent by comparing FIGS. 1 and 5. Once calculated using mathematical equations defined in government specification such as MIL-STD-3009, the radiance obtained is below 1.7E-10.

As it is known in the art, the spectral distribution of the energy emitted by light emitting diodes is variable to a limited degree with changes of semiconductor material, operating current level, and the doping used with a particular semiconductor material. Compounds of indium, gallium and phosphorus or aluminum, indium, and phosphorus provide emission in the yellow portion of the spectrum, while compounds of gallium and phosphorus; indium, gallium and phosphorus; or aluminum, indium and phosphorus provide a greenish colored emission from a light emitting diode and compounds of gallium, aluminum and arsenic; gallium, arsenic and phosphorus; or indium, gallium, arsenic and phosphorus are found to provide red colored emission. A green or blue-green colored emission is preferred for the illumination of the present invention in order that the acceptance band of the night vision apparatus be avoided. Regardless of the visible spectrum color selected for use in the present invention, it is desirable for the employed light emitting diodes 23, 25 to have zero or limited emission in the infrared spectral region, which is used for the night vision apparatus.

The dies 23, 25 can either be packaged in a single assembly or be comprised of two or more light emitting diode assembled in close proximity of nature mentioned above. Accordingly, in a different embodiment, assemblies of LEDs such as the RGB package LATBT-686 provided by Osram, may be used. In this latter case, the red LED dye is not stimulated. The electrical driving conditions of each LED are dependant on the LED die selected and are likely to differ for each of the 2 dies. As an example of this invention, a green LED with a dominant wavelength of 525 nm was driven at 5 VDC and a blue LED with a dominant wavelength of 480 nm was driven at 3.5 VDC.

The preferred embodiment is to use smaller individual dies rather than combined packaged to allow flexibility in placement and orientation in instrument design. It is preferred to position LED dies 23, 25 as closely physically possible, with the spacing between them being limited only by electrical design constraints.

Once assembled on the printed circuit board 27, the assembly is conformal-coated to improve moisture resistance as required by industry standards. Printed circuit board assemblies are usually coated during the manufacturing process in order to improve resistance to environmental stress and to enhance circuit reliability. In the present invention, a quantity of absorbing dye is added to the conformal coating solution in order to absorb small quantities of energy in between 600 and 700 nm. The conformal coating may be of the liquid acrylic type, such as Humiseal solution (1B31, MIL-I -46058, TYPE AR). Using 50 ml of Humiseal solution and soluble laser dyes, such as those provided by American Dye Source, a mixture is obtained. The dyes can be ADS680BP, 0.5 grams and ADS775MT, 0.5 grams. The mixture is combined with a solvent, such as 50 ml of N-methylpyrolidone, in order to dissolve it completely. It is then filtered through 0.1 micron absolute filter to remove any solid particles. Similar results could be obtained using other conformal coating base material such as silicone or urethane.

Once combined the light shall be blended using various knows techniques by those skilled in arts of optics. In one of the preferred embodiment of this invention, the LED dies 23, 25 are positioned in a clear to semi-clear plastic plate, approximately 0.250" thick. The bottom of the cavity is finished to a high reflective finished by painting processes or metallic insertion. The substrate hosting the LED dies 23, 25 is also finished to a high reflective standard. The optical filter may be a polycarbonate sheet, 0.076 mm thick, such as #92 provided by Roscolux film 19. The optical filter is meant to filter part of visible spectrum in order to NVIS compliance.

A different embodiment of this invention involves the use of a diffusion film 21 to blend the light of the LED dies 23, 25. Such films, different in nature and finishes will also allow sufficient light blending to achieve night vision imaging system standard compliance. The level of diffusion is design dependent and may require less or additional optical diffusion. The diffusion film 21 is to be neutral in color in order to maintain chromaticity compliance. In the case in which an absorbing coating is to be used, the coating may be applied directly on the diffusing film 21.

It will be understood that numerous modifications thereto will appear to those skilled in the art. Accordingly, the above description and accompanying drawings should be taken as illustrative of the invention and not in a limiting sense. It will further be understood that it is intended to cover any variations, uses, or adaptations of the invention following, in general, the principles of the invention and including such departures from the present disclosure as come within known or customary practice within the art to which the invention pertains and as may be applied to the essential features herein before set forth, and as follows in the scope of the appended claims.

What is claimed is:

1. An assembly of light emitting diodes combining to produce light compliant with a night vision imaging system standard, said assembly comprising:

at least one essentially green light emitting diode die having an emission of a first dominant wavelength and a first desired output intensity;

at least one essentially blue light emitting diode die having an emission of a second dominant wavelength and a second desired output intensity;

an electronic instrument component containing said at least one green light emitting diode die and at least one blue light emitting diode die arranged to provide a mixing of said green light emitting diode emission and said blue light emitting diode so as to achieve a desired spectral response;

whereby a sufficient quantity of said green light emitting diode emission is mixed with a sufficient quantity of said blue light emitting diode emission such that said resulting spectral response allows operator to perceive an essentially green light of chromaticity and radiance characteristics compliant with said night vision imaging system standard.

2. An assembly according to claim 1, wherein said first dominant wavelength is in the range of 505 nm to 540 nm and said second dominant wavelength is in the range of 420 nm to 480 nm.

3. An assembly according to claim 1, wherein said night vision imaging system standard is NVIS class A Green A.

4. An assembly according to claim 1, wherein said first light emitting diode light and said second light emitting diode light are blended using a diffusion film.

5. An assembly according to claim 1, further comprising an optical filter for filtering part of visible energy of said light produced.

6. An electronic component for use in a night vision imaging system environment, compliant to a night vision imaging system standard, comprising:

a printed circuit board assembly comprising a light source having an emission non-compliant with said night vision imaging system standard;

a conformal coating covering said printed circuit board assembly, including an absorbing agent, for filtering quantities of energy of said emission;

whereby said printed circuit board assembly is coated for electrical protection and for filtering of said emission.

7. A component according to claim 6, wherein said light source comprises at least one essentially green light emitting diode die of a first dominant wavelength overlapped and mixed with a at least one essentially blue second light emitting diode die of a second dominant wavelength.

8. A component according to claim 7, wherein said first dominant wavelength is in the range of 420 nm to 480 nm and said second dominant wavelength is in the range of 505 nm to 540 nm.

9. A component according to claim 7, wherein said first light emitting diode die and said second light emitting diode die are individually packaged.

10. A component according to claim 7, wherein said night vision imaging system standard is NVIS class A Green A.

11. A component according to claim 6, wherein said light source is at least one light emitting diode of a dominant wavelength in the range of 550 nm to 500 nm.

12. A component according to claim 11, wherein said night vision imaging system standard is NVIS class A Green B.

13. A component according to claim 6, wherein said conformal coating includes an acrylic solution and a soluble dye.

14. A component according to claim 6, wherein said absorbing agent absorbs quantities of energy in the range of 600 nm to 700 nm.

15. A component according to claim 7, wherein said first light emitting diode light and said second light emitting diode light are blended using a diffusion film.

16. A method of manufacturing an instrument panel for use in a night vision imaging system environment comprising the steps of:
providing a printed circuit board assembly comprising a light source having energy emissions;
coating said printed circuit board assembly with a conformal coating including an absorbent agent for filtering said energy emissions;
installing said printed circuit board assembly in an instrument panel such that said emissions visible to an operator wearing night vision goggles are reduced by said coating.

17. The method according to claim 16, wherein said conformal coating includes an acrylic solution and a soluble laser dye.

18. The method according to claim 16, wherein said printed circuit board assembly includes at least one light emitting diode.

* * * * *